(12) United States Patent
Kumar et al.

(10) Patent No.: US 8,373,511 B2
(45) Date of Patent: Feb. 12, 2013

(54) OSCILLATOR CIRCUIT AND METHOD FOR GAIN AND PHASE NOISE CONTROL

(75) Inventors: Ajay Kumar, Dallas, TX (US); Xiao Pu, Plano, TX (US); Krishnaswamy Nagaraj, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/905,113

(22) Filed: Oct. 15, 2010

(65) Prior Publication Data

US 2012/0092050 A1    Apr. 19, 2012

(51) Int. Cl.
*H03L 7/00* (2006.01)
(52) U.S. Cl. ........... 331/16; 331/57; 331/177 V; 331/34; 331/177 R
(58) Field of Classification Search ..................... 331/14, 331/16, 17, 177 V, 57
See application file for complete search history.

(56) References Cited

U.S. PATENT DOCUMENTS

| 7,049,866 | B2* | 5/2006 | Wilson | 327/157 |
| 7,298,227 | B2* | 11/2007 | Yu | 331/179 |
| 7,388,443 | B2* | 6/2008 | Baig et al. | 331/57 |
| 8,089,317 | B2* | 1/2012 | Fujiwara et al. | 331/16 |

* cited by examiner

*Primary Examiner* — Arnold Kinkead
(74) *Attorney, Agent, or Firm* — John R. Pessetto; W. James Brady; Frederick J. Telecky, Jr.

(57) ABSTRACT

An oscillator circuit and method for gain and phase noise control. A gain and phase noise controlled oscillator circuit includes a variable electronic oscillator and a tuning loop circuit. In operation, the variable electronic oscillator generates a clock signal and has a clock signal frequency that is controlled by a sense voltage received by the variable electronic oscillator or by one or more capacitive loads coupled to the variable electronic oscillator. Further, the tuning loop circuit is coupled to the variable electronic oscillator and compares the sense voltage to a control voltage received by the tuning loop circuit and produces one or more correction signals based on the comparison, where the one or more capacitive loads change capacitance based on the one or more correction signals.

7 Claims, 3 Drawing Sheets

OSCILLATOR CIRCUIT AND METHOD FOR GAIN AND PHASE NOISE CONTROL

TECHNICAL FIELD

Embodiments of the disclosure generally relate to the field of electronics, and more particularly to a gain and phase noise controlled oscillator circuit and method.

BACKGROUND

A number of communications standards are used in mainstream electronic devices, such as Universal Serial Bus (USB) 3.0, Frequency Modulation (FM), External Serial Advanced Technology Attachment (eSATA), and Peripheral Component Interconnect Express (PCIe). For many of these standards, requirements can limit the variance allowed with respect to bandwidth of device circuitry. For example, the PCIe standard limits the variation in loop bandwidth to 8 MHz to 16 MHz. In addition, these communications standards require limits on random jitter variation, as large jitter variations require designing circuits needing high power consumption.

For a closed loop system, the open loop gain determines a number of characteristics for that system, including loop bandwidth, and the open loop gain itself can depend on a number of factors, where gain is measured as a change in frequency for a unit change in current. For example, for an analog phase-locked loop (APLL) circuit 100 of FIG. 1, open loop gain depends on a gain of a current-controlled ring oscillator 130, response of a low pass filter 120, and current from a charge pump 115. The loop bandwidth of closed loop systems such as the APLL circuit 100 of FIG. 1 can sometimes fall outside the acceptable range for some applications, especially when process, voltage, and temperature variations in processing affect factors such as gain of oscillators, resistance of loop filters, and charge pump currents.

In particular, process, voltage, and temperature variations can affect the gain of oscillators. For example, these variations can affect the gain of the current-controlled ring oscillator 130 of FIG. 1, especially if the current-controlled ring oscillator 130 is operating in extreme conditions, such as in a strong process corner or weak process corner. The current-controlled ring oscillator 130 operates in a strong process corner if, due to fluctuations in silicon Gaussian distribution, transistors of the current-controlled ring oscillator 130 have a higher than normal drive strength, causing the current-controlled ring oscillator 130 to require a smaller voltage to operate at a normal frequency. Similarly, the current-controlled ring oscillator 130 operates in a weak process corner if, due to fluctuations in silicon Gaussian distribution, the transistors of oscillator 130 have a lower than normal drive strength, causing the current-controlled ring oscillator 130 to require a larger voltage to operate at a normal frequency. The current-controlled ring oscillator 130 operating in a strong process corner at a higher than normal frequency may show an increase in gain, with the gain further increasing if the current-controlled ring oscillator 130 is also operating in cold conditions. Likewise, the current-controlled ring oscillator 130 operating in a weak process corner at a lower than normal frequency may show a decrease in gain, with the gain further decreasing if the current-controlled ring oscillator 130 is also operating in hot conditions. Ultimately, the increases and decreases in gain of the current-controlled ring oscillator 130 due to the process, voltage, and temperature variations may lead to variance in the loop bandwidth of the APLL circuit 100 of FIG. 1. In addition, process, voltage, and temperature variations may affect phase-noise of the current-controlled ring-oscillator 130 in the APLL circuit 100.

In the APLL circuit 100 of FIG. 1, the frequency variations in an open loop of the current-controlled ring oscillator 130 are compensated in a closed loop via a feedback loop comprised of phase frequency detector 110, charge pump 115, and low pass filter 120. The feedback loop of the current-controlled ring oscillator 130 may not be able to compensate for the gain and phase-noise variations resulting from process, voltage, and temperature variations.

SUMMARY

This summary is provided to comply with 37 C.F.R. §1.73, requiring a summary of the invention briefly indicating the nature and substance of the invention. It is submitted with the understanding that it will not be used to interpret or limit the scope or meaning of the claims.

An oscillator circuit and method for gain and phase noise control are disclosed. In one aspect, a gain and phase noise controlled oscillator circuit includes a variable electronic oscillator for generating a clock signal, where frequency of the clock signal is controlled at least by a sense voltage received by the variable electronic oscillator or by one or more capacitive loads coupled to the variable electronic oscillator. The gain and phase noise controlled oscillator circuit also includes a tuning loop circuit coupled to the variable electronic oscillator, where the tuning loop circuit compares the sense voltage to a control voltage received by the tuning loop circuit and produces one or more correction signals based on the comparison, with the one or more capacitive loads change capacitance based on the one or more correction signals.

In another aspect, in a method for controlling the gain and phase noise of a variable electronic oscillator, a sense voltage is received at the variable electronic oscillator, where the frequency of a clock signal generated by the variable electronic oscillator is controlled at least by the sense voltage or by one or more capacitive loads coupled to the variable electronic oscillator. A sense voltage is then compared to a control voltage at a tuning loop circuit coupled to the variable electronic oscillator. Further, one or more correction signals are produced at the tuning loop circuit based on the comparison. Capacitance is then changed at the one or more capacitive loads based on the one or more correction signals.

In yet another aspect, a phase-locked loop circuit includes a phase frequency detector circuit coupled to a first frequency divider, where the phase frequency detector circuit detects a phase and frequency relationship between a reference signal and an output signal from the first frequency divider, and outputs charge pump control information representative of the phase and frequency relationship. The phase-locked loop circuit also includes a charge pump circuit coupled to the phase frequency detector circuit and a loop filter circuit, where the charge pump circuit increases and decreases a charge in the loop filter circuit based on the charge pump control information. The phase-locked loop circuit further includes the loop filter circuit having a resistor, a first capacitor, and a second capacitor. In addition, the phase-locked loop circuit includes a transconductor coupled to the loop filter circuit, where the transconductor provides a loop current based on the respective increase and decrease in charge in the loop filter circuit. Moreover, the phase-locked loop circuit includes a gain and phase noise controlled oscillator circuit coupled to the transconductor and to a second frequency divider having a variable electronic oscillator for generating a clock signal at an input of the second frequency divider, where frequency of the clock signal is controlled at least by a sense voltage received by the variable electronic oscillator or by one or more capacitive loads coupled to the variable electronic oscillator. The gain and phase noise controlled oscillator circuit also includes a tuning loop circuit coupled to the variable electronic oscillator, where the tuning loop circuit compares the sense voltage to a control voltage received by the tuning loop circuit and produces one or more correction signals based on the comparison, with the one or more capacitive loads change capacitance based on the one or more correction signals. Additionally, the phase-locked loop circuit includes the first frequency divider coupled to receive the clock signal from the gain and phase noise controlled oscillator circuit at an input of the first frequency divider. Furthermore, the phase-locked loop circuit includes the second frequency divider coupled to an output terminal of the phase-locked loop circuit at an output of the second frequency divider.

Other features of the embodiments will be apparent from the accompanying drawings and from the detailed description that follows.

BRIEF DESCRIPTION OF THE VIEWS OF DRAWINGS

DETAILED DESCRIPTION

Figure 1:
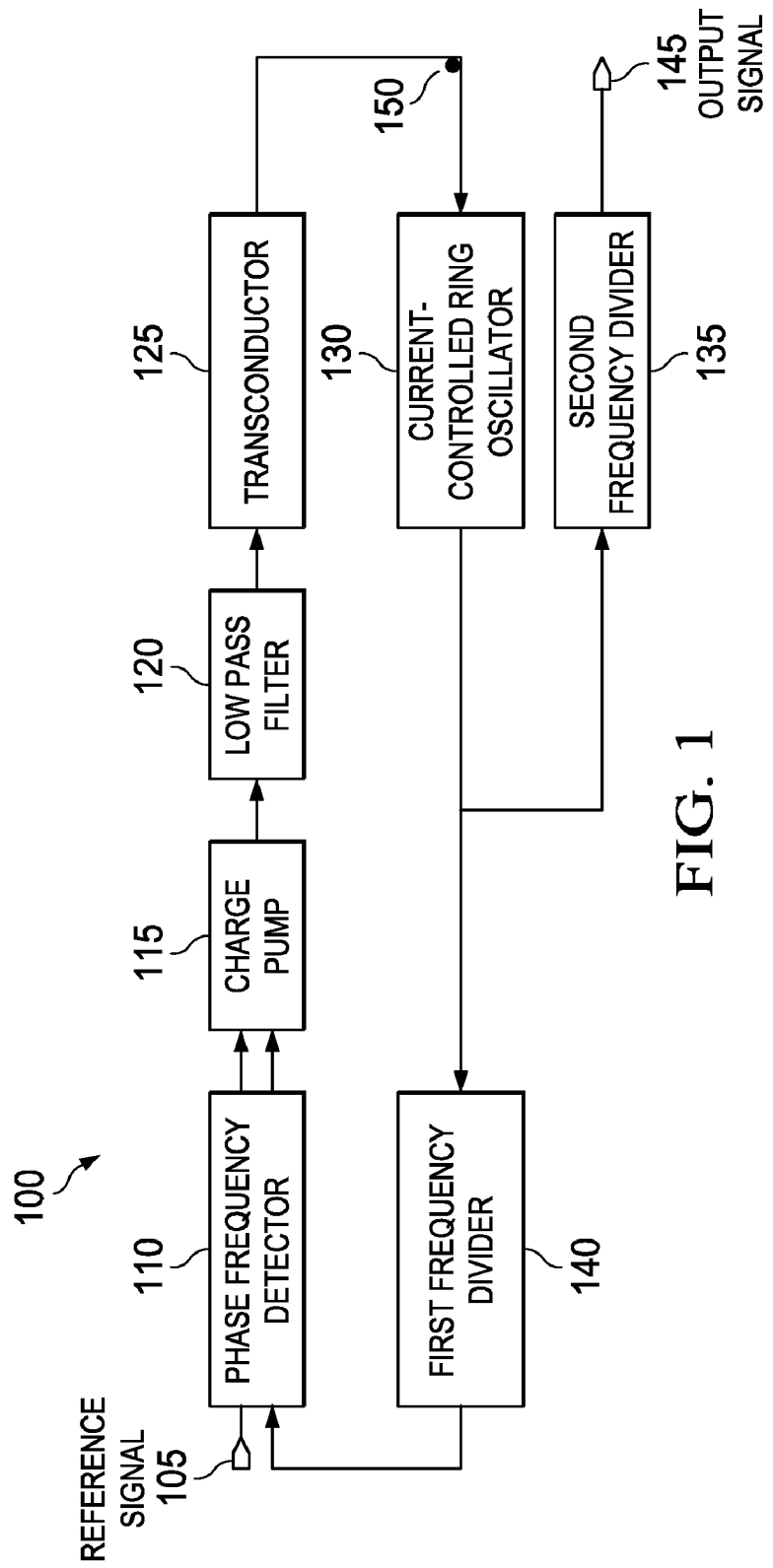
FIG. 1 illustrates a block diagram of an analog phase-locked loop (APLL) circuit.

An oscillator circuit and method for gain and phase noise control are disclosed. The following description is merely exemplary in nature and is not intended to limit the present disclosure, applications, or uses. It should be understood that throughout the drawings, corresponding reference numerals indicate like or corresponding parts and features.

Figure 2:
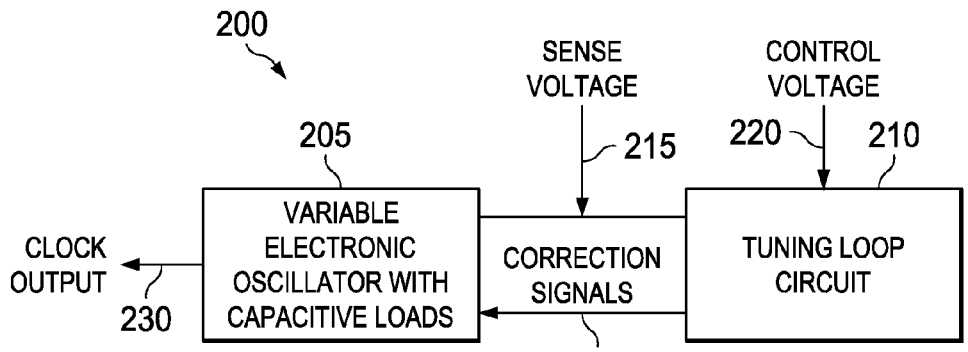
FIG. 2 illustrates a block diagram of an exemplary gain and phase noise controlled oscillator circuit, according to one embodiment.

FIG. 2 illustrates a block diagram of an exemplary gain and phase noise controlled oscillator circuit 200, according to one embodiment. The gain and phase noise controlled oscillator circuit 200 includes a variable electronic oscillator 205 with capacitive loads and a tuning loop circuit 210. The variable electronic oscillator 205 generates clock signals at clock output 230, with a sense voltage 215 provided by the variable electronic oscillator 205. It is appreciated that the variable electronic oscillator 205 can be a number of oscillator circuits, including, but not limited to, voltage-controlled oscillators, current-controlled oscillators, ring oscillators, and inductor capacitor (LC) tank circuits.

The frequency of the clock signals is also controlled by capacitive loads (e.g., the variable capacitors 330 of FIG. 3) connected to the variable electronic oscillator 205. It is appreciated that the capacitive loads can be a number of capacitive elements, including, but not limited to, variable capacitors and varactors. The tuning loop circuit 210 is coupled to the variable electronic oscillator 205. In an exemplary operation, the tuning loop 210 compares the sense voltage 215 to a control voltage 220 received by the tuning loop circuit 210. Based on the comparison between the voltages, the tuning loop circuit 210 produces one or more correction signals 225 to be received at the capacitive loads of variable electronic oscillator 205. The capacitive loads change capacitance based on the one or more correction signals 225. Therefore, in one embodiment, the comparison between the sense voltage 215 and control voltage 220 at the tuning loop circuit 220 can alter the frequency of the clock signals at the clock output 230.

Variations in process, voltage, and temperature can cause the frequency, gain, and phase-noise of the variable electronic oscillator 215 to vary. These variations can also cause a variation of the sense voltage 215. By monitoring the sense voltage 215 and then changing the capacitive loads of the variable electronic oscillator 205 with help of the tuning loop circuit 210, the gain and phase-noise variations can be arrested.

Figure 3:
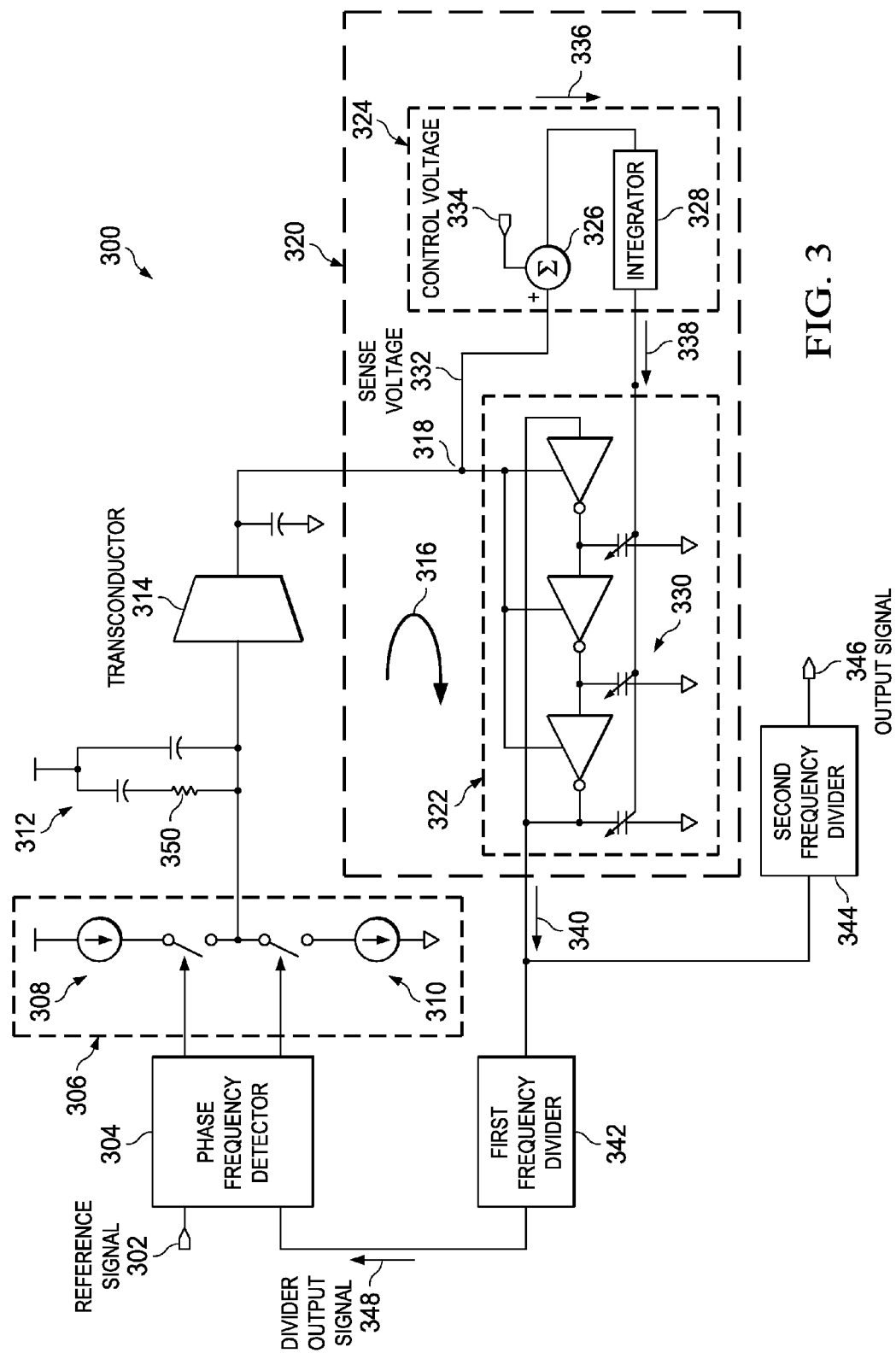
FIG. 3 illustrates a circuit diagram of an APLL circuit implementing a gain and phase noise controlled oscillator circuit, according to one embodiment.

FIG. 3 illustrates a circuit diagram of an analog phased-lock loop (APLL) circuit 300 implementing a gain and phase noise controlled oscillator circuit 320, according to one embodiment. It is noted that the circuit 320 is an exemplary embodiment of the gain and phase noise controlled oscillator circuit 200 of FIG. 2. It is also appreciated that the gain and phase noise controlled oscillator circuit 200 can be implemented in a number of circuits, including, but not limited to, APLLs, frequency synthesizers, clock generator circuits, digital phase-locked loops (DPLLs), and all-digital phase-locked loops (ADPLLs).

A phase frequency detector (PFD) circuit 304 receives a reference signal 302. In the example embodiment of FIG. 3, the reference signal 302 is derived from a crystal oscillator existing externally from the APLL circuit 300. The PFD circuit 304 also receives a divider output signal 348 from a first frequency divider 342. The PFD circuit 304 detects a phase and frequency relationship between the reference signal 302 and the divider output signal 348, where the PFD circuit 304 outputs control information representative of the phase and frequency differences between the reference signal 302 and the divider output signal 348 to a charge pump 306. It is appreciated that the PFD circuit 304 can be a number of detection circuits, including, but not limited to, digital PFD circuits, analog PFD circuits, analog phase detector (PD) circuits, digital PD circuits, and Gilbert cell mixers.

The charge pump circuit 306 is coupled to the PFD circuit 304 and a loop filter circuit 312. The charge pump circuit 306 increases and decreases a charge in the loop filter circuit 312 based on the control information received from the PFD circuit 304. To increase charge, a current source 308 flows into the loop filter circuit 312. To decrease charge, a current sink 310 sinks the current out of the loop filter circuit 312. The loop filter circuit 312 includes a resistor 350 and two capacitors arranged as shown in FIG. 3. It is appreciated that the loop filter circuit 312 can be a number of circuits, including, but not limited to, low-pass filter circuits, one pole one zero filter circuits, and two pole one zero filter circuits. A transconductor 314 is coupled to the loop filter circuit 312, and is used to drive a loop current 316 derived from a converted voltage at the loop filter circuit 312. The loop current 316 goes to the gain and phase noise controlled oscillator circuit 320, with the converted voltage of the loop filter circuit 312 equal to a sense voltage 332 at a node 318. In another embodiment, the transconductor 314 can be replaced by a voltage buffer circuit, where the voltage buffer circuit operates to buffer the converted voltage with a drive strength to provide the loop current 316 required by the gain and phase controlled oscillator circuit 320.

The gain and phase noise controlled oscillator circuit 320 includes a current-controlled ring oscillator 322 coupled to a tuning loop circuit 324. The current-controlled ring oscillator 322 is configured to generate a clock signal 340 at the inputs of a first frequency divider 342 and a second frequency divider 344, with the divider output signal 348 of the first frequency divider 342 going to the PFD circuit 304 and an output signal 346 of the second frequency divider 344 fed externally. A bank of variable capacitors 330 is coupled to all internal phases of the current-controlled ring oscillator 322. It is appreciated that the bank of variable capacitors 330 can include any even or odd number of capacitors, where the capacitors each correspond to a phase of the current-controlled ring oscillator 322. The tuning loop circuit 324 includes a comparator 326 and an integrator 328 connected in a negative feedback configuration. It is appreciated that the integrator 328 can include either a digital or analog integrator.

In an exemplary operation, the frequency of the clock signal 340 from the current-controlled ring oscillator 322 is controlled by the sense voltage 332 at node 318, as well as the bank of variable capacitors 330. The tuning loop circuit 324 utilizes the comparator 326 to compare the sense voltage 332 and a control voltage 334 received at the comparator 326. The control voltage 334 can be derived from any stable voltage source and can be set to a pre-determined level. In an exemplary embodiment, the control voltage 334 is set to an amount within an ideal operating range for the current-controlled ring oscillator 322. The comparator 326 detects a difference between the sense voltage 332 and the control voltage 334 and produces a difference signal 336 based on the detected difference. In an exemplary embodiment, the control voltage 334 is greater than the sense voltage 332, resulting in the comparator 326 producing a logic one for the difference signal 336. Likewise, in another exemplary embodiment, the control voltage 334 is less than the sense voltage 332, resulting in the comparator 326 producing a logic zero for the difference signal 336. In another embodiment, the comparator 326 can instead produce an absolute value for the difference signal 336.

The difference signal 336 is accumulated at an integrator 328, and the integrator 328 produces one or more correction signals 338 based on the accumulation. The one or more correction signals 338 are then fed to the bank of variable capacitors 330, where variable capacitors may change capacitance based on the one or more correction signals 338. In an exemplary operation, the integrator 328 is a thermometric counter, and counts up while receiving a logic one for the difference signal 336 and counts down while receiving a logic zero for the difference signal 336.

For example, if the thermometric counter receives three logic one signals, the thermometric counter may output this value as correction signals 338 to the bank of variable capacitors 330. Increasing and decreasing capacitance at the current-controlled ring oscillator 322 can respectively increase and decrease the sense voltage 332 at the node 318. In an exemplary embodiment, the integrator 328 employs a hysteresis. The tuning loop circuit 324 repeats the use of the comparator 326 and the integrator 328 until the sense voltage 332 holds within an acceptable range of the control voltage 334. In an exemplary embodiment, arresting the sense voltage 332 within the acceptable range of the control voltage 334 can lead to constant phase noise and gain of the current-controlled ring oscillator 322 across process, voltage, and temperature variations. Arresting the sense voltage 332 within a range can lead to an arresting of the gain and phase-noise of the current-controlled ring oscillator 322 within a range. In an exemplary embodiment, increasing the number of capacitors in the bank of variable capacitors 330 can allow for a finer resolution of the acceptable range of the control voltage 334. Finer resolution in the bank of variable capacitors 330 can result in bounding the phase-noise and gain of the current-controlled ring oscillator 322 within a finer range.

Figure 4:
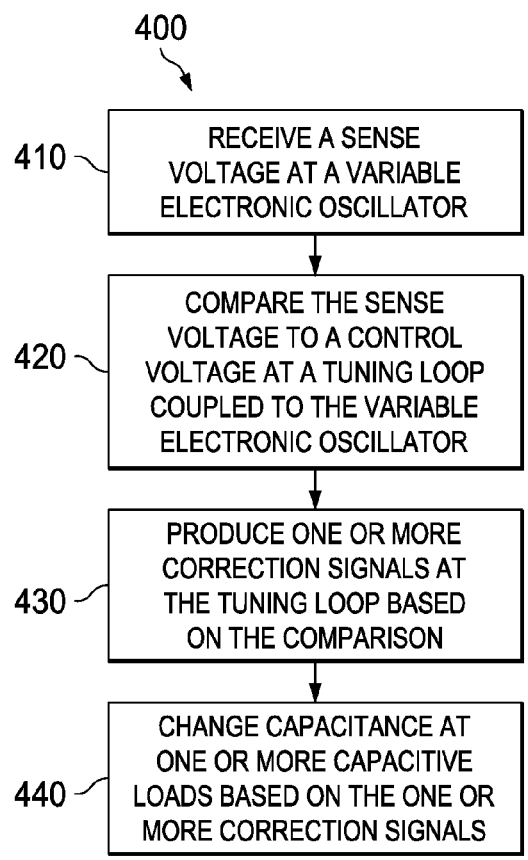
FIG. 4 illustrates a process flow chart of an exemplary method for controlling gain and phase noise of a variable electronic oscillator, according to one embodiment.

FIG. 4 illustrates a process flow chart of an exemplary method 400 for controlling the gain and phase noise of a variable electronic oscillator, according to one embodiment. In operation 410, a sense voltage is received at the variable electronic oscillator, where the frequency of a clock signal generated by the variable electronic oscillator is controlled by the sense voltage or by one or more capacitive loads coupled to the variable electronic oscillator. For example, as illustrated in FIG. 3, the converted voltage of the loop filter circuit 312 is fed as the sense voltage 332 to the current-controlled ring oscillator 322, with the current-controlled ring oscillator 322 coupled to a bank of variable capacitors 330.

In operation 420, the sense voltage is compared to a control voltage at a tuning loop coupled to the variable electronic oscillator. For example, as illustrated in FIG. 3, the tuning loop circuit 324 coupled to the current-controlled ring oscillator 322 utilizes a comparator 324 to compare the sense voltage 332 and a control voltage 334 received at the comparator 326. In operation 430, one or more correction signals are produced at the tuning loop based on the comparison. For example, as illustrated in FIG. 3, the difference signal 336 is accumulated at an integrator 328, and the integrator 328 produces one or more correction signals 338 based on the accumulation. In operation 440, the capacitance at the one or more capacitive loads is changed based on the one or more correction signals. For example, as illustrated in FIG. 3, the one or more correction signals 338 are fed to the bank of variable capacitors 330, where variable capacitors may change capacitance based on the one or more correction signals 338.

In various embodiments, the circuits and methods described in FIGS. 1 through 4, allow the loop bandwidth and random jitter demands of eSATA and PCIe standards to be met for closed loop systems. In addition, the circuits and methods described above can save area in the loop filter and save power in the ring oscillator. Further, variation in gain and phase noise has been arrested and reduced to required levels in many conditions, including strong and weak corners. In an exemplary embodiment, phase-noise changed by plus-minus 1%, and bandwidth changed by plus-minus 10%.

The various devices, modules, analyzers, generators, etc. described herein may be enabled and operated using hardware circuitry (e.g., complementary metal-oxide-semiconductor (CMOS) based logic circuitry), firmware, software and/or any combination of hardware, firmware, and/or software (e.g., embodied in a machine readable medium). Further, the various electrical structure and methods may be embodied using transistors, logic gates, and/or electrical circuits (e.g., application specific integrated circuit (ASIC)). Although the present embodiments have been described with reference to specific example embodiments, it will be evident that various modifications and changes may be made to these embodiments without departing from the broader spirit and scope of the various embodiments. For example, the present embodiments are discussed in terms of an APLL. However, the present embodiments can be applied to various phase-locked loop designs, as well as other circuit designs.

What is claimed is:
1. A gain and phase noise controlled oscillator circuit, comprising:
    a variable electronic oscillator for generating a clock signal, wherein frequency of the clock signal is controlled at least by a sense voltage received by the variable electronic oscillator; wherein one or more capacitive loads are coupled to the variable electronic oscillator; and a tuning loop circuit coupled to the variable electronic oscillator, wherein the tuning loop circuit compares the sense voltage to a control voltage received by the tuning loop circuit and produces one or more correction signals based on the comparison, wherein the one or more capacitive loads change capacitance based on the one or more correction signals;

wherein the tuning loop circuit comprises:

a comparator to compare the sense voltage to the control voltage received by the tuning loop circuit, wherein the comparator detects a difference between the sense voltage and the control voltage and produces a difference signal based on the difference; and an integrator for accumulating the difference signal and producing the one or more correction signals based on the accumulation, wherein the integrator comprises an up/down thermometric counter.

2. A phase-locked loop circuit, comprising:

a phase frequency detector circuit coupled to a first frequency divider, wherein the phase frequency detector circuit detects a phase and frequency relationship between a reference signal and an output signal from the first frequency divider, and outputs charge pump control information representative of the phase and frequency relationship;

a charge pump circuit coupled to the phase frequency detector circuit and a loop filter circuit, wherein the charge pump circuit increases and decreases a charge in the loop filter circuit based on the charge pump control information;

a loop filter circuit comprising a resistor, a first capacitor, and a second capacitor;

a transconductor coupled to the loop filter circuit, wherein the transconductor provides a loop current based on the respective increase and decrease in charge in the loop filter circuit;

a gain and phase noise controlled oscillator circuit coupled to the transconductor and to a second frequency divider, comprising:

a variable electronic oscillator for generating a clock signal at an input of the first frequency divider and an input of the second frequency divider, wherein frequency of the clock signal is controlled at least by a sense voltage received by the variable electronic oscillator; wherein one or more capacitive loads are coupled to the variable electronic oscillator; and a tuning loop circuit coupled to the variable electronic oscillator, wherein the tuning loop circuit compares the sense voltage to a control voltage received by the tuning loop circuit and produces one or more correction signals based on the comparison, wherein the one or more capacitive loads change capacitance based on the one or more correction signals;

the first frequency divider coupled to receive the clock signal from the gain and phase noise controlled oscillator circuit at an input of the first frequency divider; and the second frequency divider coupled to an output terminal of the phase-locked loop circuit at an output of the second frequency divider.

3. The phase-locked loop circuit of claim 2, wherein the tuning loop circuit of the gain and phase noise controlled oscillator circuit comprises:

a comparator to compare the sense voltage to the control voltage received by the tuning loop circuit, wherein the comparator detects a difference between the sense voltage and the control voltage and produces a difference signal based on the difference; and an integrator for accumulating the difference signal and producing the one or more correction signals based on the accumulation.

4. The phase-locked loop circuit of claim 3, wherein the difference signal comprises a logic one if the sense voltage is less than the control voltage, and a logic zero if the sense voltage is greater than the control voltage.

5. The phase-locked loop circuit of claim 3, wherein the integrator comprises an up/down thermometric counter.

6. The phase-locked loop circuit of claim 2, wherein the variable electronic oscillator comprises a current-controlled ring oscillator.

7. The phase-locked loop circuit of claim 2, wherein the one or more capacitive loads comprise one or more variable capacitors.

* * * * *